(12) United States Patent
Chen et al.

(10) Patent No.: US 8,270,178 B2
(45) Date of Patent: Sep. 18, 2012

(54) ACTIVE DEVICE ARRAY SUBSTRATE

(75) Inventors: Po-Lin Chen, Hsinchu (TW);
Chih-Yuan Lin, Taipei (TW); Yu-Min Lin, Changhua County (TW);
Chun-Nan Lin, Changhua County (TW)

(73) Assignee: Au Optronics Corporation, Hsinchu (TW)

( * ) Notice: Subject to any disclaimer, the term of this patent is extended or adjusted under 35 U.S.C. 154(b) by 253 days.

(21) Appl. No.: 12/822,201

(22) Filed: Jun. 24, 2010

(65) Prior Publication Data

US 2011/0228502 A1 Sep. 22, 2011

(30) Foreign Application Priority Data

Mar. 22, 2010 (TW) ................................. 99108356 A

(51) Int. Cl.
*H05K 7/00* (2006.01)
*H01L 27/14* (2006.01)
*H01L 23/48* (2006.01)

(52) U.S. Cl. .......... 361/777; 361/772; 257/72; 257/741; 257/762

(58) Field of Classification Search ........................ None
See application file for complete search history.

(56) References Cited

U.S. PATENT DOCUMENTS

| | | |
|---|---|---|
| 5,694,184 A | 12/1997 | Yamada et al. |
| 6,111,619 A | 8/2000 | He et al. |
| 6,165,917 A | 12/2000 | Batey et al. |
| 6,255,706 B1 | 7/2001 | Watanabe et al. |
| 6,420,282 B1 | 7/2002 | Batey et al. |
| 6,686,661 B1 | 2/2004 | Lee et al. |
| 6,780,784 B2 | 8/2004 | Jo et al. |
| 7,008,548 B2 | 3/2006 | Chae et al. |
| 7,052,993 B2 | 5/2006 | Lee et al. |
| 7,157,323 B2 | 1/2007 | Gan et al. |
| 7,177,003 B2 | 2/2007 | Kim |
| 7,247,911 B2 * | 7/2007 | Tsai et al. ...................... 257/347 |
| 7,276,732 B2 | 10/2007 | Lee et al. |
| 7,289,183 B2 | 10/2007 | Gan et al. |
| 7,304,383 B2 | 12/2007 | Cho et al. |
| 7,332,383 B2 | 2/2008 | Fang et al. |
| 7,352,004 B2 | 4/2008 | Lee et al. |
| 7,384,831 B2 | 6/2008 | Tsai et al. |
| 7,528,466 B2 * | 5/2009 | Liu et al. ...................... 257/642 |

(Continued)

FOREIGN PATENT DOCUMENTS

CN 1851883 10/2006

(Continued)

OTHER PUBLICATIONS

"First Office Action of China Counterpart Application", issued on Oct. 10, 2011, p. 1-p. 5.

*Primary Examiner* — Boris Chervinsky
(74) *Attorney, Agent, or Firm* — Jianq Chyun IP Office

(57) ABSTRACT

An active device array substrate has at least one patterned conductive layer. The patterned conductive layer includes a copper layer. A cross-section of the copper layer which is parallel to a normal line direction of the copper layer includes a first trapezoid and a second trapezoid stacked on the first trapezoid. A base angle of the first trapezoid and a base angle of the second trapezoid are acute angles, and a difference between the base angle of the first trapezoid and the base angle of the second trapezoid is from about 5° to about 30°.

10 Claims, 4 Drawing Sheets

U.S. PATENT DOCUMENTS

| | | | |
|---|---|---|---|
| 7,566,404 B2 * | 7/2009 | Liu et al. | 216/13 |
| 7,829,393 B2 * | 11/2010 | Liu et al. | 438/144 |
| 7,902,670 B2 * | 3/2011 | Lin et al. | 257/762 |
| 2004/0242000 A1 | 12/2004 | Jo et al. | |
| 2009/0173944 A1 * | 7/2009 | Chen et al. | 257/66 |

FOREIGN PATENT DOCUMENTS

| | | |
|---|---|---|
| CN | 100524694 | 8/2009 |
| TW | 200730985 | 8/2007 |

* cited by examiner

ACTIVE DEVICE ARRAY SUBSTRATE

CROSS-REFERENCE TO RELATED APPLICATION

This application claims the priority benefit of Taiwan application serial no. 99108356, filed on Mar. 22, 2010. The entirety of the above-mentioned patent application is hereby incorporated by reference herein and made a part of this specification.

BACKGROUND OF THE INVENTION

1. Field of the Invention

The invention is related to an active device array substrate, and in particular to an active device array substrate which has a copper conductive layer.

2. Description of Related Art

As panel sizes of thin film transistor liquid crystal displays (TFT-LCD) become larger and larger, this enlargement is accompanied by resistor capacitor (RC) delay effects caused by resistance values of metal wires which are not low enough. Signals are hence distorted during transmission, thereby affecting the display quality of the panels. By using a single layer of copper which has low resistance as a metal wire, RC delay effects are effectively reduced. However, after the copper is fabricated, copper oxide is formed on the surface of the copper. Since the rates at which the copper oxide on the surface of the copper and the copper are etched are different, disconnection of wires may easily occur during etching.

SUMMARY OF THE INVENTION

The invention provides an active device array substrate which has better electrical characteristics.

The invention provides an active device array substrate which effectively reduces the disconnection rate of wires.

The invention provides an active device array substrate which has at least one patterned conductive layer. The patterned conductive layer includes a copper layer. A cross-section of the copper layer which is substantially parallel to a normal line direction of the copper layer includes a first trapezoid and a second trapezoid stacked on the first trapezoid. A base angle of the first trapezoid and a base angle of the second trapezoid are acute angles. A difference between the base angle of the first trapezoid and the base angle of the second trapezoid is from about 5° to about 30°.

According to an embodiment of the invention, the difference between the base angle of the first trapezoid and the base angle of the second trapezoid is, for example, from about 7° to about 13°.

According to an embodiment of the invention, the difference between the base angle of the first trapezoid and the base angle of the second trapezoid is, for example, about 10°.

According to an embodiment of the invention, the patterned conductive layer further includes a barrier layer. The copper layer is stacked on the barrier layer.

According to an embodiment of the invention, the material of the barrier layer is at least one selected from the group consisting of molybdenum, a molybdenum alloy, titanium, a titanium alloy, an aluminum alloy, and a copper alloy.

According to an embodiment of the invention, the height of the first trapezoid is, for example, greater than the height of the second trapezoid.

According to an embodiment of the invention, the height of the first trapezoid is, for example, from about 1500 angstroms to about 5000 angstroms, and the height of the second trapezoid is, for example, from about 50 angstroms to about 1500 angstroms.

According to an embodiment of the invention, the height of the first trapezoid is, for example, from about 2500 angstroms to about 5000 angstroms, and the height of the second trapezoid is, for example, from about 50 angstroms to about 2500 angstroms.

According to an embodiment of the invention, the patterned conductive layer forms a plurality of gates of a plurality of active devices.

According to an embodiment of the invention, the patterned conductive layer forms a plurality of sources/drains of a plurality of active devices.

The invention provides a fabricating method of an active device array substrate which includes the following steps. First, a first copper layer is deposited at a first deposition rate on a substrate. Next, a second copper layer is deposited at a second deposition rate on the first copper layer, wherein the first deposition rate is greater than the second deposition rate. The first copper layer and the second copper layer are then patterned.

According to an embodiment of the invention, after the first copper layer and the second copper layer are patterned, a first cross-section of the first copper layer which is parallel to a normal line direction of the first copper layer is, for example, a first trapezoid, and a second cross-section of the second copper layer which is parallel to the normal line direction of the first copper layer is, for example, a second trapezoid. A base angle of the first trapezoid and a base angle of the second trapezoid are acute angles, and the difference between the base angle of the first trapezoid and the base angle of the second trapezoid is from about 5° to about 30°.

According to an embodiment of the invention, the depositing method of the first copper layer and the second copper layer includes sputtering.

According to an embodiment of the invention, the first deposition rate is at least two times the second deposition rate.

According to an embodiment of the invention, before the first copper layer is deposited, a step of depositing a barrier layer on the substrate is further included. The first copper layer is deposited on the barrier layer.

Due to the above, in the active device array substrate provided by the invention, since the base angle of the first trapezoid and the base angle of the second trapezoid are acute angles, and the difference between the base angle of the first trapezoid and the base angle of the second trapezoid is from about 5° to about 30°, the active device array substrate has a better exterior structure, so that formation of structural defects are effectively prevented, thereby improving electrical characteristics.

In addition, in the fabricating method of the active device array substrate provided by the invention, since the first deposition rate is greater than the second deposition rate, the second copper layer has a better arrangement of atoms, less thin film defects, and a lower oxidation rate, so that the disconnection rate of wires is effectively lowered.

In order to make the aforementioned and other objects, features and advantages of the invention comprehensible, embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

FIGS. 1A to 1G are schematic cross-sectional views showing a fabrication process of an active device array substrate according to an embodiment of the invention. FIG. 2 is a schematic cross-sectional view along another direction of a patterned conductive layer 122 in FIG. 1E, wherein the cross-section direction of FIG. 2 is perpendicular to the cross-section direction of FIG. 1E.

Figure 1A:
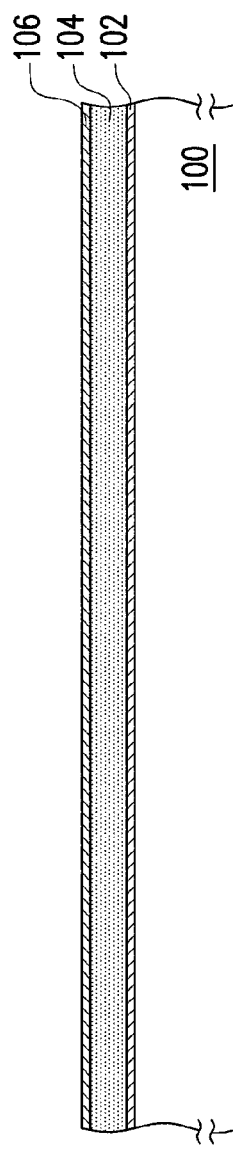
FIGS. 1A to 1G are schematic cross-sectional views showing a fabrication process of an active device array substrate according to an embodiment of the invention.
Figure 2:
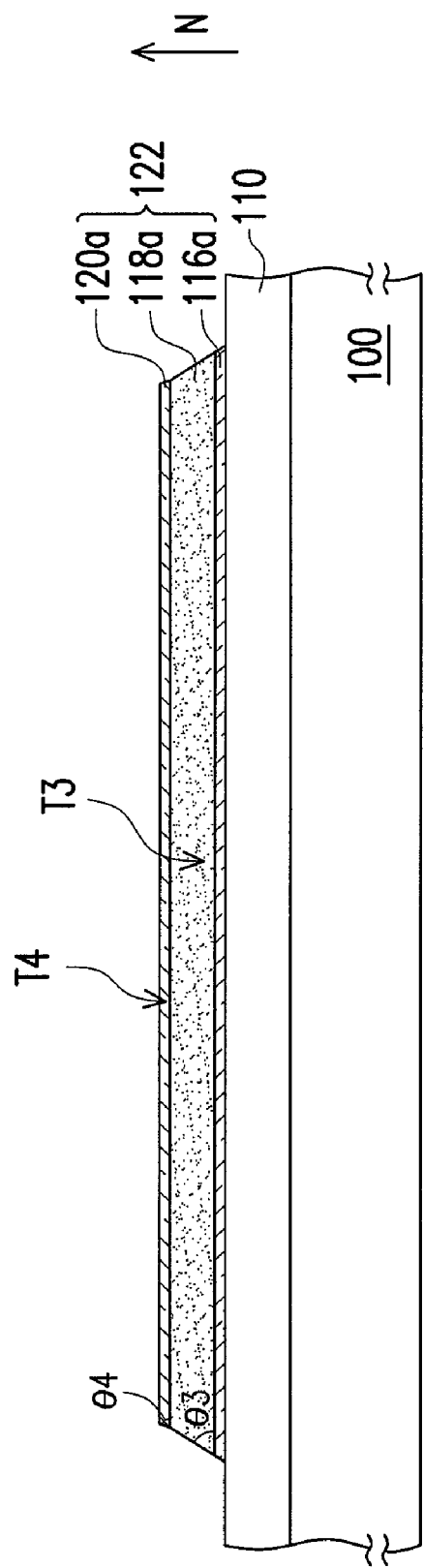
FIG. 2 is a schematic cross-sectional view along another direction of a patterned conductive layer 122 in FIG. 1E, wherein the cross-section direction of FIG. 2 is perpendicular to the cross-section direction of FIG. 1E.

First, please refer to FIG. 1A. A substrate 100 is provided. The material of the substrate 100 is a transparent material, a non-transparent material, a flexible material, or any combination of the above.

Next, a barrier layer 102 is optionally/selectively formed on the substrate 100. The material of the barrier layer 102 is at least one selected from the group consisting of molybdenum, a molybdenum alloy, titanium, a titanium alloy, an aluminum alloy, and a copper alloy. The method of forming the barrier layer 102 is, for example, a physical vapor deposition method.

Next, a copper layer 104 is deposited at a first deposition rate on the barrier layer 102. The method of forming the copper layer 104 is, for example, sputtering.

Next, a copper layer 106 is deposited at a second deposition rate on the copper layer 104, wherein the first deposition rate is substantially greater than the second deposition rate. The first deposition rate is, for example, at least two times the second deposition rate. The method of forming the copper layer 106 and the copper layer 104 is, for example, a sputtering method.

Figure 1B:
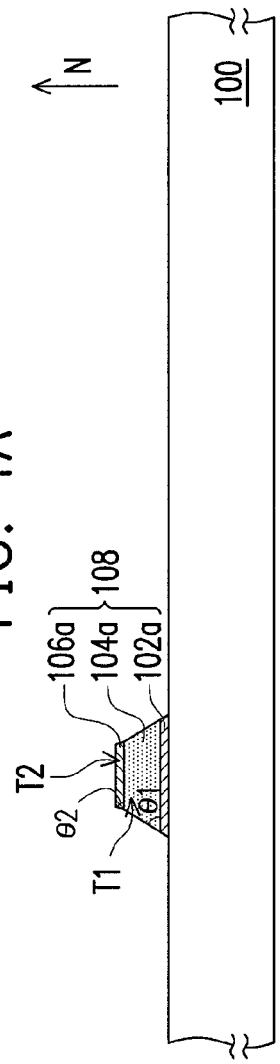

Afterwards, please refer to FIG. 1B. The copper layer 106, the copper layer 104, and the barrier layer 102 are patterned, so as to form a patterned conductive layer 108, which is used as a gate, on the substrate 100. The patterned conductive layer 108 includes a copper layer 106a, a copper layer 104a, and a barrier layer 102a formed by patterning the copper layer 106, the copper layer 104, and the barrier layer 102.

Here, a cross-section of the copper layer 104a which is substantially parallel to a normal line direction N of the copper layer 104a is, for example, a trapezoid T1, a cross-section of the copper layer 106a which is substantially parallel to the normal line direction N of the copper layer 104a is, for example, a trapezoid T2. A base angle θ1 of the trapezoid T1 and a base angle θ2 of the trapezoid T2 are acute angles, and the difference between the base angle θ1 of the trapezoid T1 and the base angle θ2 of the trapezoid T2 is, for example, from about 5° to about 30°. According to an embodiment of the invention, the difference between the base angle θ1 of the trapezoid T1 and the base angle θ2 of the trapezoid T2 is from about 7° to about 13°, for example about 10°. The base angle θ1 is, for example, substantially smaller than the base angle θ2. The base angle θ1 is substantially smaller than 70°, and the base angle θ2 is substantially smaller than 80°.

In addition, the height of the trapezoid T1 is substantially greater than the height of the trapezoid T2, but the height of the trapezoid T2 may be substantially greater than or substantially equal to the height of the trapezoid T1 in other embodiments. The height of the trapezoid T1 and T2 is from about 50 angstroms to about 5000 angstroms. Generally speaking, the height of the trapezoid T1 is, for example, from about 2500 angstroms to about 5000 angstroms, and the height of the trapezoid T2 is, for example, from about 50 angstroms to about 2500 angstroms. In some embodiment, the height of the trapezoid T1 is, for example, from about 1500 angstroms to about 5000 angstroms, and the height of the trapezoid T2 is, for example, from about 50 angstroms to about 1500 angstroms.

It should be noted that according the present embodiment, the term "trapezoid" includes any shape that is substantially a trapezoid. In other words, as long as a shape is substantially similar to a trapezoid in appearance, the shape is a so-called trapezoid according to the present embodiment. In addition, according to the present embodiment, the base angles of the trapezoid are what are conventionally known as "taper angles".

Figure 1C:
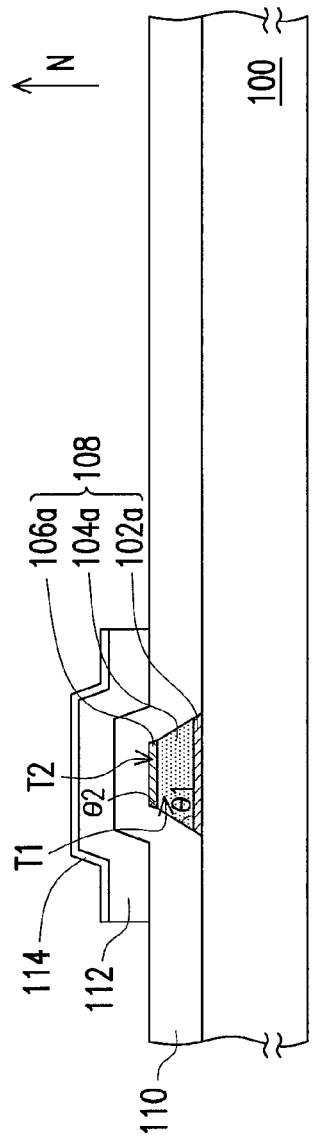

Afterwards, please refer to FIG. 1C. A dielectric layer 110 is formed on the substrate 100, so as to cover the patterned conductive layer 108. The method of forming the dielectric layer 110 is, for example, a chemical vapor deposition method or other suitable thin film deposition techniques. The invention, however, is not limited to the above. The dielectric layer 110 may have a single-layered or multiple-layered structure, and the material thereof may be an inorganic material, organic material, another dielectric material, or combinations of the above. The present embodiment is illustrated in a way that the material of the dielectric layer 110 is a dielectric material such as silicon oxide, silicon nitride, or silicon oxynitride, or other suitable materials.

Next, a channel layer 112 and an ohmic contact layer 114 are formed in a manner in which the channel layer 112 and the ohmic contact layer 114 are stacked on the patterned conductive layer 108 and the dielectric layer 110. The channel layer 112 and the ohmic contact layer 114 are, for example, semiconductor layers which have different dopant concentrations. The method of forming the channel layer 112 and the ohmic contact layer 114 is, for example, a suitable deposition method and patterning method which are not repeatedly described.

Figure 1D:
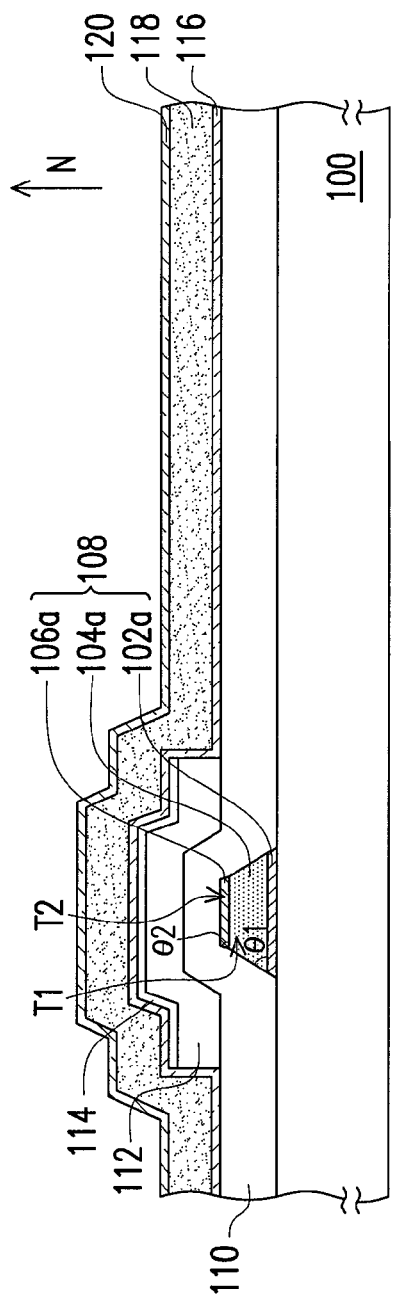

Please refer to FIG. 1D. A barrier layer 116 is optionally/selectively formed on the substrate 100. The barrier layer 116 covers the dielectric layer and the ohmic contact layer 114. The material of the barrier layer 116 is at least one selected from the group consisting of molybdenum, a molybdenum alloy, titanium, a titanium alloy, an aluminum alloy, and a copper alloy. The method of forming the barrier layer 116 is, for example, a physical vapor deposition method.

Then, a copper layer 118 is deposited at a third deposition rate on the barrier layer 116. The method of forming the copper layer 118 is, for example, a sputtering method.

Next, a copper layer 120 is deposited at a fourth deposition rate on the copper layer 118, wherein the third deposition rate is substantially greater than the fourth deposition rate, and the third deposition rate is, for example, at least two times the fourth deposition rate. The method of forming the copper layer 120 and the copper layer 118 is, for example, sputtering.

Figure 1E:
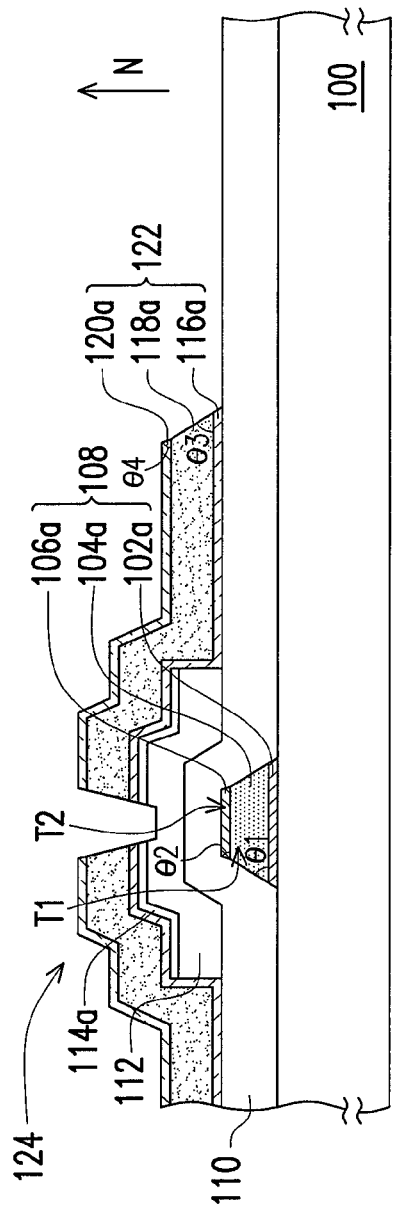

Afterwards, please refer to FIG. 1E. The copper layer 120, the copper layer 118, and the barrier layer 116 are patterned, and the patterned conductive layer 122 which is used as a source and drain is formed on the channel layer 112 which is on two sides of the patterned conductive layer 108. After the patterned conductive layer 122 is formed, a portion of the ohmic contact layer 114 may be removed, so as to form the ohmic contact layer 114a. The patterned conductive layer 122 includes a copper layer 120a, a copper layer 118a, and a barrier layer 116a formed by patterning the copper layer 120, the copper layer 118, and the barrier layer 116.

Please also refer to FIG. 2. A cross-section of the copper layer 118a which is substantially parallel to the normal line direction N of the copper layer 118a is, for example, a trapezoid T3, a cross-section of the copper layer 120a which is substantially parallel to the normal line direction N of the copper layer 118a is, for example, a trapezoid T4. A base angle θ3 of the trapezoid T3 and a base angle θ4 of the trapezoid T4 are acute angles, and the difference between the base angle θ3 of the trapezoid T3 and the base angle θ4 the trapezoid T4 is, for example, from about 5° to about 30°. According to an embodiment of the invention, the difference between the base angle θ3 of the trapezoid T3 and the base angle θ4 of the trapezoid T4 is from about 7° to about 13°, for example about 10°. The base angle θ3 is, for example, smaller than the base angle θ4. The base angle θ1 is substantially smaller than 70θ1 is, for example, smaller than 70°, and the base angle θ2 is substantially smaller than 80θ2 is, for example, smaller than 80°, for example.

In addition, the height of the trapezoid T3 is, for example, substantially greater than the height of the trapezoid T4. The height of the trapezoid T3 is, for example, from about 1500 angstroms to about 5000 angstroms, and the height of the trapezoid T4 is, for example, from about 50 angstroms to about 1500 angstroms.

By implementing the above, primary steps of fabricating the thin film transistor 124 have been completed. The thin film transistor 124 includes the patterned conductive layer 108 (which is used as the gate), the channel layer 112, the ohmic contact layer 114a, and the patterned conductive layer 122 (which is used as the source and the drain).

Figure 1F:
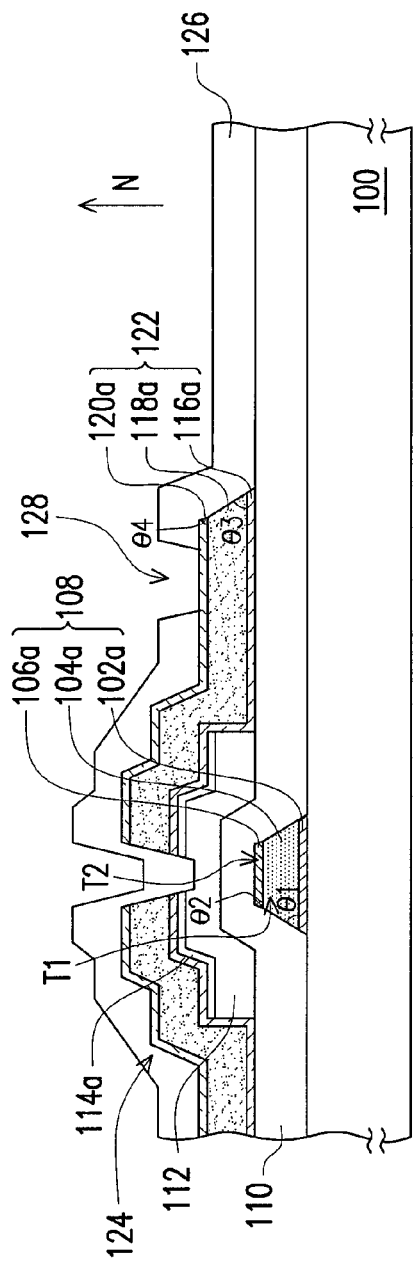

Next, please refer to FIG. 1F. A passivation layer 126 is formed on the thin film transistor 124, wherein the passivation layer 126 has an opening 128. The opening 128 exposes a portion of the patterned conductive layer 122 which is used as the drain. The passivation layer 126 may have a single-layered or multiple-layered structure, and the material thereof may be an inorganic material, organic material, another dielectric material, or combinations of the above. When the material of the passivation layer 126 is an inorganic material such as silicon nitride, or silicon oxide, or other suitable materials, the method of forming the passivation layer 126 which has the opening is, for example, forming a passivation material layer (not shown) over the whole substrate 100, and then performing a patterning process on the passivation material layer.

Figure 1G:
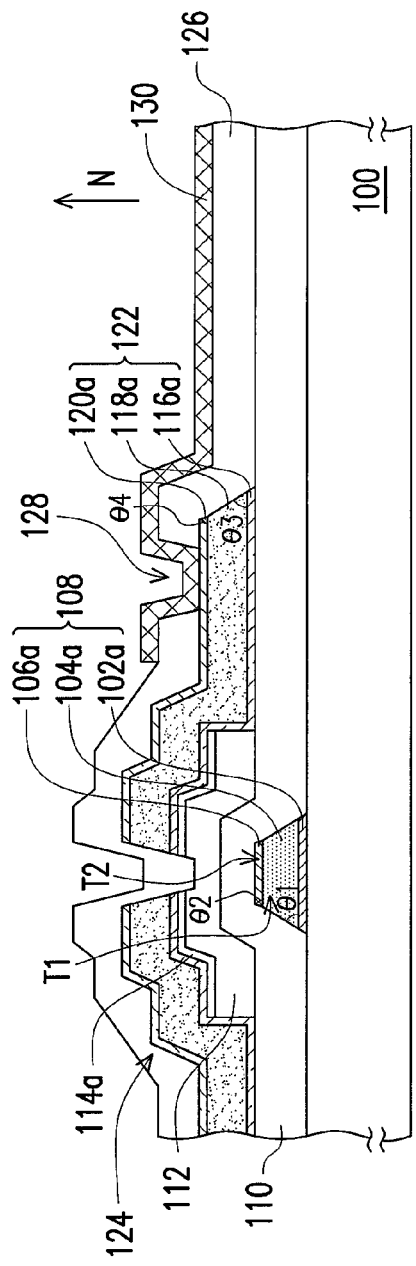

Please refer to FIG. 1G. A pixel electrode 130 is formed on the passivation layer 126, wherein the pixel electrode 130 is electrically connected, via the opening 128, to the portion of the patterned conductive layer 122 of the thin film transistor 124 that is used as the drain. The pixel electrode 130 may have a single-layered or multiple-layered structure, and the material thereof may be a transparent material, a non-transparent material, or combinations of the above. The present embodiment is illustrated in a way that indium tin oxide (ITO) and/or a transparent material of indium zinc oxide (IZO) is used as an example. The invention, however, is not limited to the above. The method of forming the pixel electrode 130 is, for example, forming a pixel electrode layer (not shown) by sputtering, and then performing a patterning process on the pixel electrode.

It is known from the above embodiment that compared with the deposition rates of the copper layers 104a and 108a, since the deposition rates of the copper layers 106a and 120a respectively covering the copper layers 104a and 118a are substantially slower, the copper layers 106a and 120a have better arrangements of atoms, less thin film defects, and lower oxidation rates, thereby greatly reducing the disconnection rate of wires in the active device array substrate.

It should be noted that although to the above embodiment is described in a way that the method of forming the patterned conductive layer is used as an example to form each of the gate (the patterned conductive layer 108) and the source and the drain (the patterned conductive layer 122), the invention is not limited to the above. In other words, any situation, in which any of the gate, the scan line, the source, the drain, the data line, other metal lines, and other metal electrodes is fabricated by the above fabricating method of the patterned conductive layer, is within the scope of the fabricating method of the active device array substrate of the invention.

In the following, the active device array substrate according to an embodiment of the invention is illustrated by using FIG. 1G. The active device array substrate may be applied to liquid crystal displays (LCD), thin film transistor-organic light emitting diodes (TFT-OLED), electronic paper, or other products.

Please refer to FIG. 1G. The active device array substrate has at least a patterned conductive layer. The patterned conductive layer includes a copper layer. The copper layer in the patterned conductive layer may be a single-layered or multiple-layered structure. As long as a cross-section of the copper layer which is substantially parallel to a normal line direction of the copper layer includes two trapezoid which are stacked, and that the base angles are acute angles which have a difference from about 5° to about 30°, the patterned conductive layer is within the scope of the invention.

For example, in the active device array substrate shown in FIG. 1G, the patterned conductive layer in the active device array substrate is the patterned conductive layer 108 which is used as the gate and the patterned conductive layer 122 which is used as the source and the drain. The copper layer in the patterned conductive layer 108 is, for example, a double-layered structure formed by stacking of the copper layers 104a and 106a, and the copper layer in the patterned conductive layer 122 is, for example, a double-layered structure formed by stacking of the copper layers 118a and 120a. The invention, however, is not limited to the above.

The cross-section of the copper layer of the patterned conductive layer 108 which is substantially parallel to the normal line direction N of the copper layer includes the trapezoid T1 (which is the cross-section of the copper layer 104a) and the trapezoid T2 (which is the cross-section of the copper layer 106a) stacked on the trapezoid T1. The base angle θ1 of the trapezoid T1 and the base angle θ2 of the trapezoid T2 substantially are acute angles, and the difference between the base angle θ1 of the trapezoid T1 and the base angle θ2 of the trapezoid T2 is, for example, from about 5° to about 30°. According to an embodiment of the invention, the difference between the base angle θ1 of the trapezoid T1 and the base angle θ2 of the trapezoid T2 is from about 7° to about 13°, for example about 10°. The base angle θ1 is, for example, substantially smaller than the base angle θ2. The base angle θ1 is substantially smaller than 70θ1 is, for example, smaller than 70°, and the base angle θ2 is substantially smaller than 80θ2 is, for example, smaller than 80°, for example. In addition, the height of the trapezoid T1 is substantially greater than the height of the trapezoid T2. The height of the trapezoid T1 is, for example, from about 1500 angstroms to about 5000 angstroms, and the height of the trapezoid T2 is, for example, from about 50 angstroms to about 1500 angstroms.

Please also refer to FIG. 2. The cross-section of the copper layer of the patterned conductive layer 122 which is substantially parallel to the normal line direction N of the copper layer includes the trapezoid T3 (which is the cross-section of the copper layer 118a) and the trapezoid T4 (which is the cross-section of the copper layer 120a) stacked on the trapezoid T3. The base angle θ3 of the trapezoid T3 and the base angle θ4 of the trapezoid T4 are acute angles, and the difference between the base angle θ3 of the trapezoid T3 and the base angle θ4 the trapezoid T4 is from about 5° to about 30°, for example. According to an embodiment of the invention, the difference between the base angle θ3 of the trapezoid T3 and the base angle θ4 of the trapezoid T4 is from about 7° to about 13°, for example about 10°. The base angle θ3 is, for example, substantially smaller than the base angle θ4. The base angle θ1 is substantially smaller than 70°, and the base angle θ2 is substantially smaller than 80°, for example. In addition, the height of the trapezoid T3 is, for example, substantially greater than the height of the trapezoid T4. The height of the trapezoid T3 and T4 is from about 50 angstroms to about 5000 angstroms. Generally speaking, the height of the trapezoid T3 is, for example, from about 2500 angstroms to about 5000 angstroms, and the height of the trapezoid T4 is, for example, from about 50 angstroms to about 2500 angstroms. In some embodiment, the height of the trapezoid T3 is, for example, from about 1500 angstroms to about 5000 angstroms, and the height of the trapezoid T4 is, for example, from about 50 angstroms to about 1500 angstroms.

In addition, the patterned conductive layers 108 and 112 may further include the barrier layers 102a and 116a, respectively. The copper layer 104a is stacked on the barrier layer 102a, and the copper layer 118a is stacked on the barrier layer 116a. The materials of the barrier layers 102a and 116a is at least one selected from the group consisting of molybdenum, a molybdenum alloy, titanium, a titanium alloy, an aluminum alloy, and a copper alloy.

Moreover, the active device array substrate further includes elements such as the substrate 100, the dielectric layer 110, the channel layer 112, the ohmic contact layer 114a, the passivation layer 126, and the pixel electrode 130. The manner in which these elements are disposed, the materials of these elements, and the method of forming these elements have already been elaborated above and are hence not repeatedly described.

Due to the above, in the active device array substrate provided by the invention, since the base angle θ1 (or θ3) of the trapezoid T1 (or T3) and the base angle θ2 (or θ4) trapezoid T2 (or T4) substantially are acute angles, and the difference between the base angle θ1 (or θ3) of the trapezoid T1 (or T3) and the base angle θ2 (or θ4) of the trapezoid T2 (or T4) is from about 5° to about 30°, the active device array substrate has a better exterior structure, so that formation of structural defects are effectively prevented, thereby improving electrical characteristics.

However, the patterned conductive layer according to the present embodiment is illustrated in an exemplary way that the patterned conductive layer is used as the gate (the patterned conductive layer 108) and the source and the drain (the patterned conductive layer 122). Any situation in which any of the gate, the scan line, the source, the drain, the data line, other metal lines, and other metal electrodes has the structure of the above patterned conductive layer is within the scope of the invention.

Table 1 is a comparison chart of disconnection rates of wires according to the conventional art and the invention.

TABLE 1

| | Copper wire structure | Cross-section | Thickness of lower copper layer (angstroms) | Thickness of upper copper layer (angstroms) | Disconnection rate of wires (opening/square meter) |
|---|---|---|---|---|---|
| Comparative embodiment 1 | Single-layer | Single trapezoid | about 5000 | | about 0.55 |
| Comparative embodiment 2 | Single-layer | Single trapezoid | about 5000 | | about 0.32 |
| Experimental embodiment 1 | Double-layer | Two trapezoids | about 4500 | about 500 | about 0.18 |
| Experimental embodiment 2 | Double-layer | Two trapezoids | about 4500 | about 500 | about 0.23 |
| Experimental embodiment 3 | Double-layer | Two trapezoids | about 4500 | about 500 | about 0.10 |

According to Table 1, in comparative embodiments 1 and 2, when a copper layer is formed, the copper layer is formed only by a single, rapid, and high power deposition process, so that after the copper layer is patterned to form a copper wire, the cross-section is a single trapezoid, and the copper wire has a higher disconnection rate.

In experimental embodiments 1, 2, and 3, when a copper layer is formed, a lower copper layer is formed by a rapid and high power deposition, and an upper copper layer is then formed by a slow and low power deposition process (which has a power ⅓ of the high power deposition process), and the upper copper layer is stacked on the lower copper layer to form stacked copper layers. Hence, after the stacked copper layers are patterned to form a copper wire, the cross-section has two trapezoids, and the copper wire has a lower disconnection rate.

In summary, the above embodiments have at least the following advantages.

1. The above fabricating method of the active device array substrate effectively reduces the disconnection rate of wires.

2. The active device array substrate has better electrical characteristics.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. An active device array substrate, having at least one patterned conductive layer which comprises a copper layer, wherein a cross-section of the copper layer which is substantially parallel to a normal line direction of the copper layer comprises a first trapezoid and a second trapezoid stacked on the first trapezoid, a base angle of the first trapezoid and a base angle of the second trapezoid are acute angles, and a difference between the base angle of the first trapezoid and the base angle of the second trapezoid is from about 5° to about 30°.

2. The active device array substrate as claimed in claim 1, wherein the difference between the base angle of the first trapezoid and the base angle of the second trapezoid is from about 7° to about 13°.

3. The active device array substrate as claimed in claim 1, wherein the difference between the base angle of the first trapezoid and the base angle of the second trapezoid is about 10°.

4. The active device array substrate as claimed in claim 1, wherein the patterned conductive layer further comprises a barrier layer, the copper layer being stacked on the barrier layer.

5. The active device array substrate as claimed in claim 1, wherein a material of the barrier layer is at least one selected from the group consisting of molybdenum, a molybdenum alloy, titanium, a titanium alloy, an aluminum alloy, and a copper alloy.

6. The active device array substrate as claimed in claim 1, wherein a height of the first trapezoid is greater than a height of the second trapezoid.

7. The active device array substrate as claimed in claim 1, wherein the height of the first trapezoid is from about 1500 angstroms to about 5000 angstroms and the height of the second trapezoid is from about 50 angstroms to about 1500 angstroms.

8. The active device array substrate as claimed in claim 1, wherein the height of the first trapezoid is from about 2500 angstroms to about 5000 angstroms and the height of the second trapezoid is from about 50 angstroms to about 2500 angstroms.

9. The active device array substrate as claimed in claim 1, wherein the patterned conductive layer forms plurality of gates of a plurality of active devices.

10. The active device array substrate as claimed in claim 1, wherein the patterned conductive layer forms a plurality of sources/drains of a plurality of active devices.

* * * * *